United States Patent
Vampola et al.

Patent Number: 5,391,868
Date of Patent: Feb. 21, 1995

[54] LOW POWER SERIAL BIAS PHOTOCONDUCTIVE DETECTORS

[75] Inventors: John L. Vampola, Santa Barbara; Christopher A. Hougen, Oxnard; Kevin L. Pettijohn, Goleta, all of Calif.

[73] Assignee: Santa Barbara Research Center, Goleta, Calif.

[21] Appl. No.: 28,505

[22] Filed: Mar. 9, 1993

[51] Int. Cl.6 .............................................. H01J 40/14
[52] U.S. Cl. ................................ 250/208.1; 250/214.4
[58] Field of Search ............... 250/214.1, 208.1, 208.2, 250/210

[56] References Cited

U.S. PATENT DOCUMENTS

| | | | |
|---|---|---|---|
| 2,789,193 | 4/1951 | Anderson | 250/214.1 |
| 3,202,827 | 8/1965 | Robinson | 250/214.1 |
| 3,984,677 | 10/1976 | Hosoe et al. | 250/208.2 |
| 4,641,359 | 2/1987 | Okibayashi et al. | 250/214.1 |
| 4,650,984 | 3/1987 | Furushima et al. | 250/214.1 |

*Primary Examiner*—David C. Nelms
*Attorney, Agent, or Firm*—W. C. Schubert; W. K. Denson-Low

[57] ABSTRACT

An array (10) of photoconductive (PC) radiation detectors includes a substrate (1) and a body (12) of PC material that is disposed upon the substrate. The body of PC material has a substantially linear shape. A plurality of electrical interconnects (14, 15) are electrically coupled to the body of PC material for differentiating the body into a plurality of radiation detector sites, individual ones of the plurality of radiation detector sites being disposed in a serial arrangement with one another along a length of the body of PC material. The array further includes a bias current input terminal (16) that is electrically coupled to a first end of the body of PC material and a bias current output terminal (18) that is electrically coupled to a second end of the body of PC material. As a result, a bias current that is applied to the bias current input terminal, and that is extracted from the bias current output terminal, flows through each of the plurality of serially disposed radiation detector sites. Signal processing circuitry (32) has inputs coupled to the plurality of electrical interconnects, and includes differential amplifiers (34) for determining a difference in potential between two adjacent ones of the plurality of electrical interconnects. The difference in potential is a function of an amount radiation that is absorbed by a radiation detector site at an intervening portion of the body of PC material.

13 Claims, 5 Drawing Sheets

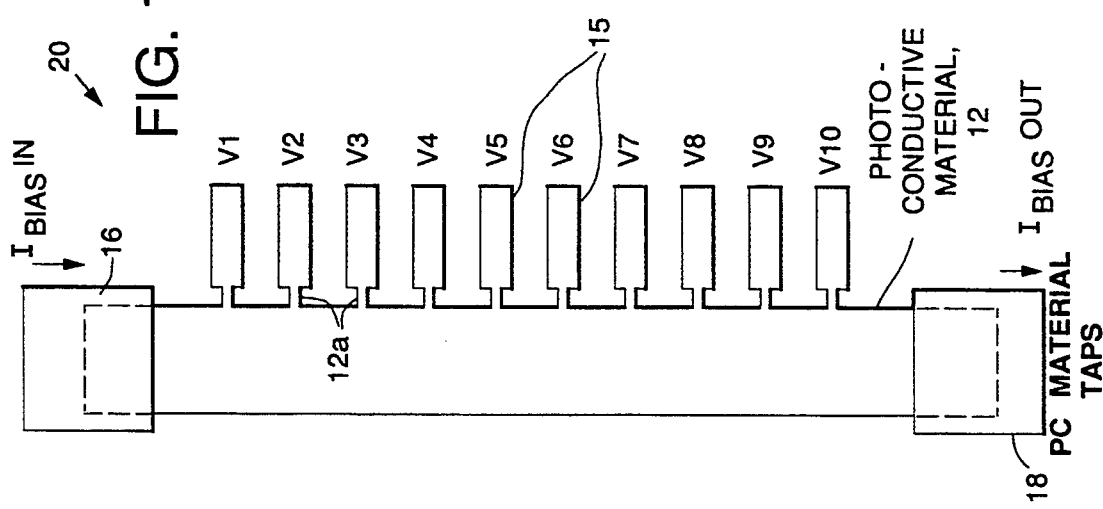
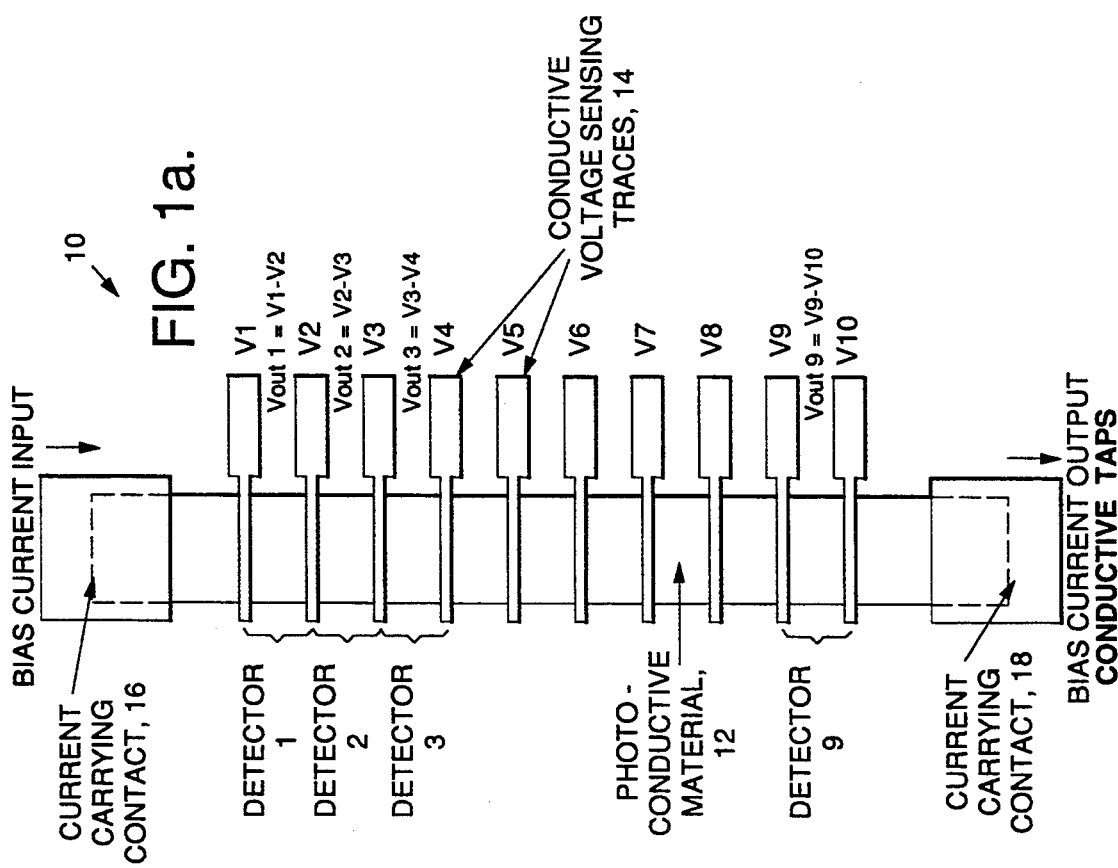

SERPENTINE
WITH TAPS

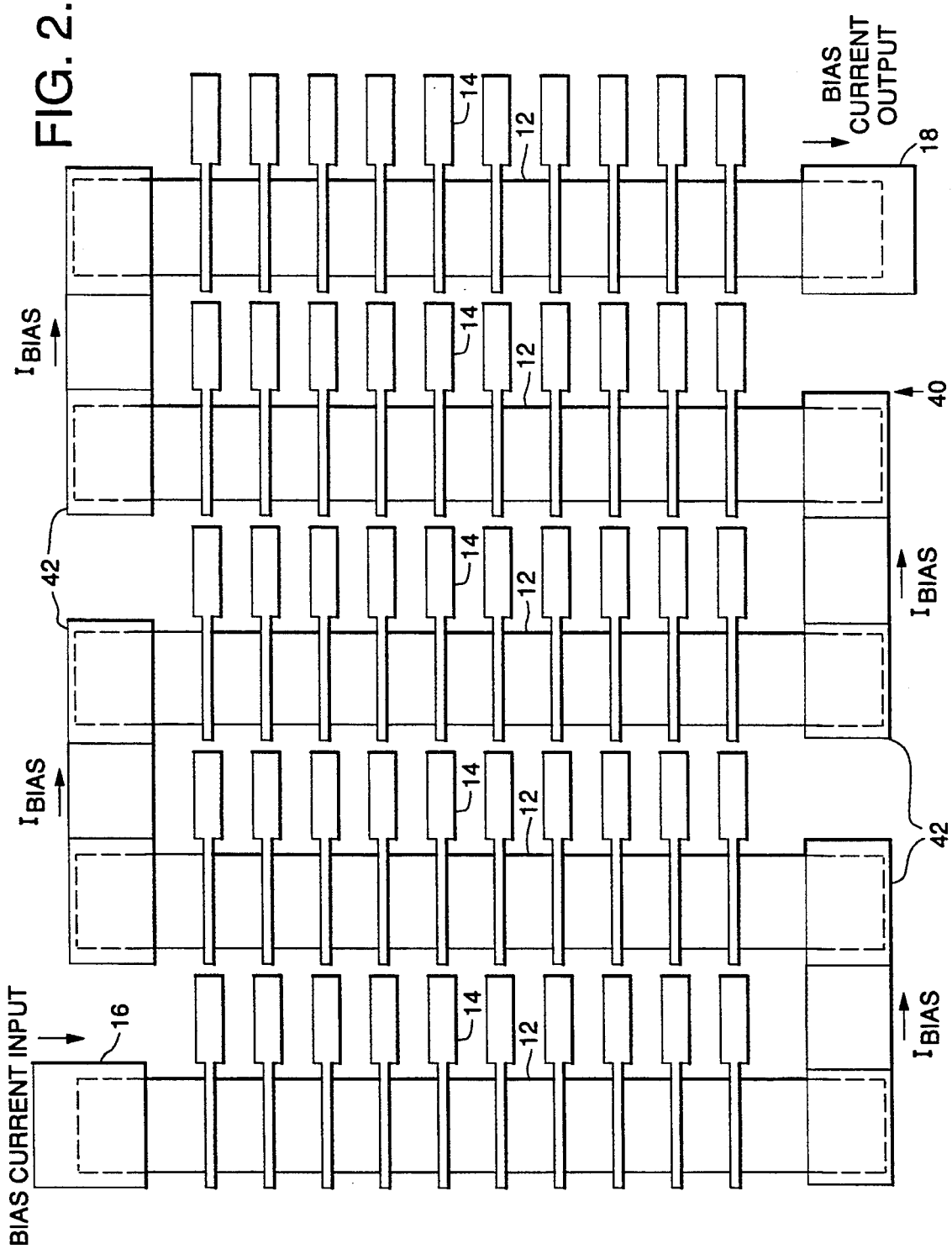

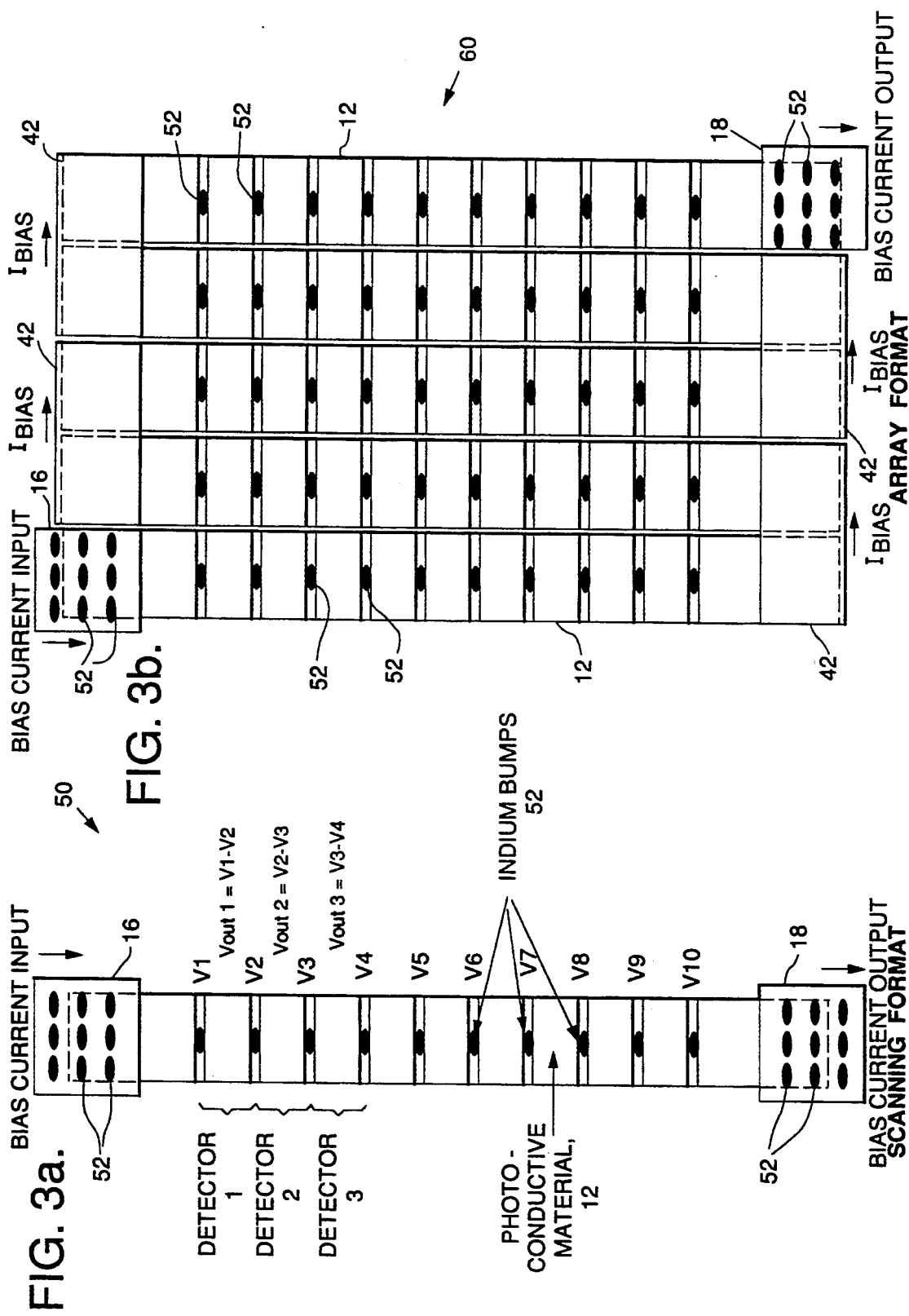

LOW POWER SERIAL BIAS PHOTOCONDUCTIVE DETECTORS

FIELD OF THE INVENTION

This invention relates generally to radiation detectors and, in particular, to arrays of photoconductive radiation detectors.

BACKGROUND OF THE INVENTION

Many conventional types of photoconductive (PC) mercury-cadmium-telluride (HgCdTe), and other low impedance detectors, require separate biasing circuitry for each detector element of an array of such detectors. This requirement makes the layout and subsequent fabrication of large area PC arrays difficult to accomplish. This requirement also complicates the provision of support circuitry and cabling, and also increases the power consumption of the cabling.

In general, each element of the array requires two current carrying connections or leads to provide an input and an output for a bias current. During operation, the array is positioned at a focal plane of a suitable optical system. The absorption of infrared (IR) radiation by a photodetector element causes a change in the resistance of the element. In a constant current mode of operation, this change in resistance can be sensed as a change in potential across the element. Signal processing circuitry, including amplifiers and multiplexers, measures and reads out the change in potential, which is an indication of the magnitude of the IR flux that is incident on the element.

The array may be provided in a front-side illuminated configuration, wherein the elements are fabricated upon a radiation receiving surface of a suitable substrate. In the front-side illuminated configuration, the required signal processing circuitry may be provided at a periphery of the substrate or upon a back-side of the substrate. In a back-side illuminated configuration, the array is upon a surface of a transparent (at the wavelengths of interest) substrate, and the radiation is incident upon the opposite surface of the substrate. The radiation passes through the substrate to the array elements. For the back-side illuminated configuration, conventional practice often places the signal processing circuitry upon a separate substrate which is mated, or hybridized, with the radiation detector array substrate. Interconnects between the two substrates may take the form of indium bumps. The bumps are formed at required locations on the radiation detector and are subsequently mated with appropriately placed contact pads on the signal processing circuit substrate.

The aforementioned problem of providing two current carrying terminals to each element of the array is present in both the front-side illuminated and the back-side illuminated configurations.

It is thus an object of this invention to provide an improved array of photoconductive elements that does not require a separate pair of current carrying contacts for each element of the array, thereby overcoming the restrictions present in the prior art.

It is further object of this invention to provide only two current carrying leads for a plurality of photoconductive elements, thereby facilitating the fabrication of on-focal plane integrated circuits for amplification and multiplexing, and for also providing a significant reduction in support electronics, cabling, and power consumption.

SUMMARY OF THE INVENTION

The foregoing problems are overcome and other advantages are realized by a photoconductive detector arrangement wherein a plurality of discrete radiation detector pixels or elements are connected together in a series configuration so as to have a single bias current input and a single bias current output. One embodiment of the invention employs a linear strip of photoconductive material. The linear strip of photoconductive material is delineated into individual detector elements with spaced apart taps made along the linear strip. All of the detector elements share a single set of bias current leads, input and output, that bias up a single strip of detectors, or multiple, interconnected strips of detectors to form an area array. Only the bias leads are required to carry any significant currents, thereby reducing the power consumption and simplifying the layout and fabrication of the array.

The objects of the invention are realized by an array of photoconductive (PC) radiation detectors that includes a substrate and a body of PC material that is disposed upon a first surface of the substrate. The body of PC material has a substantially linear shape having a length and a width. The length may be significantly greater than the width, but is not required to have any specific size relationship to the width. A plurality of electrical interconnects are electrically coupled to the body of PC material for differentiating the body into a plurality of radiation detector sites. Individual ones of the plurality of radiation detector sites are disposed in a serial arrangement with one another along the length of the body of PC material. The array further includes a bias current input terminal that is electrically coupled to a first end of the body of PC material and a bias current output terminal that is electrically coupled to another end of the body of PC material. As a result of this arrangement, a bias current that is applied to the bias current input terminal, and that is extracted from the bias current output terminal, flows through each of the plurality of serially coupled radiation detector sites.

Signal processing circuitry has inputs coupled to the plurality of electrical interconnects, and includes differential amplifiers for determining a difference in potential appearing between two adjacent ones of the plurality of electrical interconnects. The difference in potential is a function of an amount of radiation that is absorbed by a radiation detector element at an intervening portion of the body of PC material.

In the disclosed embodiments of the invention the body of PC material is comprised of elements selected from Group IIB-VIA of the periodic table, for example HgCdTe, and a bandgap of the PC material is selected for absorbing IR radiation. However, the teaching of this invention is not limited for use with any one specific type of photoresponsive material, nor is the teaching of this invention limited for use in detecting electromagnetic radiation within any one specific band of wavelengths.

BRIEF DESCRIPTION OF THE DRAWING

The above set forth and other features of the invention will be made more apparent in the ensuing Detailed Description of the Invention when read in conjunction with the attached Drawing, wherein:

FIGS. 1a, 1b, and 1c and 1d illustrate three exemplary embodiments of the invention, wherein FIG. 1a shows a top view of a linear PC array comprised of nine detectors having conductive traces that overlay the PC material, FIG. 1b shows a top view of a linear PC array comprised of nine detectors having taps made to the PC material, and FIGS. 1c and 1d shows a top view and 1d an enlarged view of a PC array comprised of nine detectors each having a serpentine geometry and conductive traces;

FIG. 2 shows top view of a front-side illuminated embodiment wherein a plurality of the 9×1 arrays of FIG. 1a are interconnected together to form a 9×5 PC detector area array;

FIG. 3a shows a top view of an embodiment suitable for use in a back-side illuminated configuration, wherein a linear PC array is comprised of nine detectors having conductive taps, the taps and bias current terminals further being provided with indium bumps for interfacing to external signal processing circuitry;

FIG. 3b shows a top view of back-side illuminated embodiment wherein a plurality of the arrays of FIG. 3a are interconnected together to form a 9×5 PC detector area array; and FIG. 4 is an elevational view, not to scale, of a portion of the linear PC detector array of FIG. 1a.

DETAILED DESCRIPTION OF THE INVENTION

A number of embodiments of the invention are described below with respect to the Figures. In all of these embodiments the PC detector array is formed on a suitable substrate through the use of photolithographic and other conventional fabrication techniques.

Figure 1D:
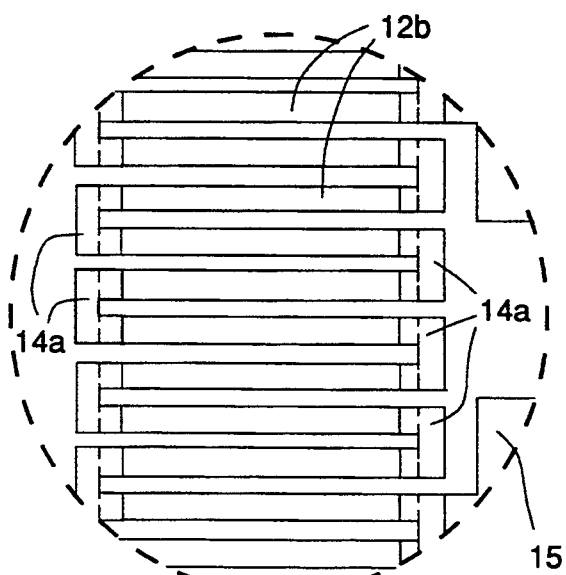
Figure 4:
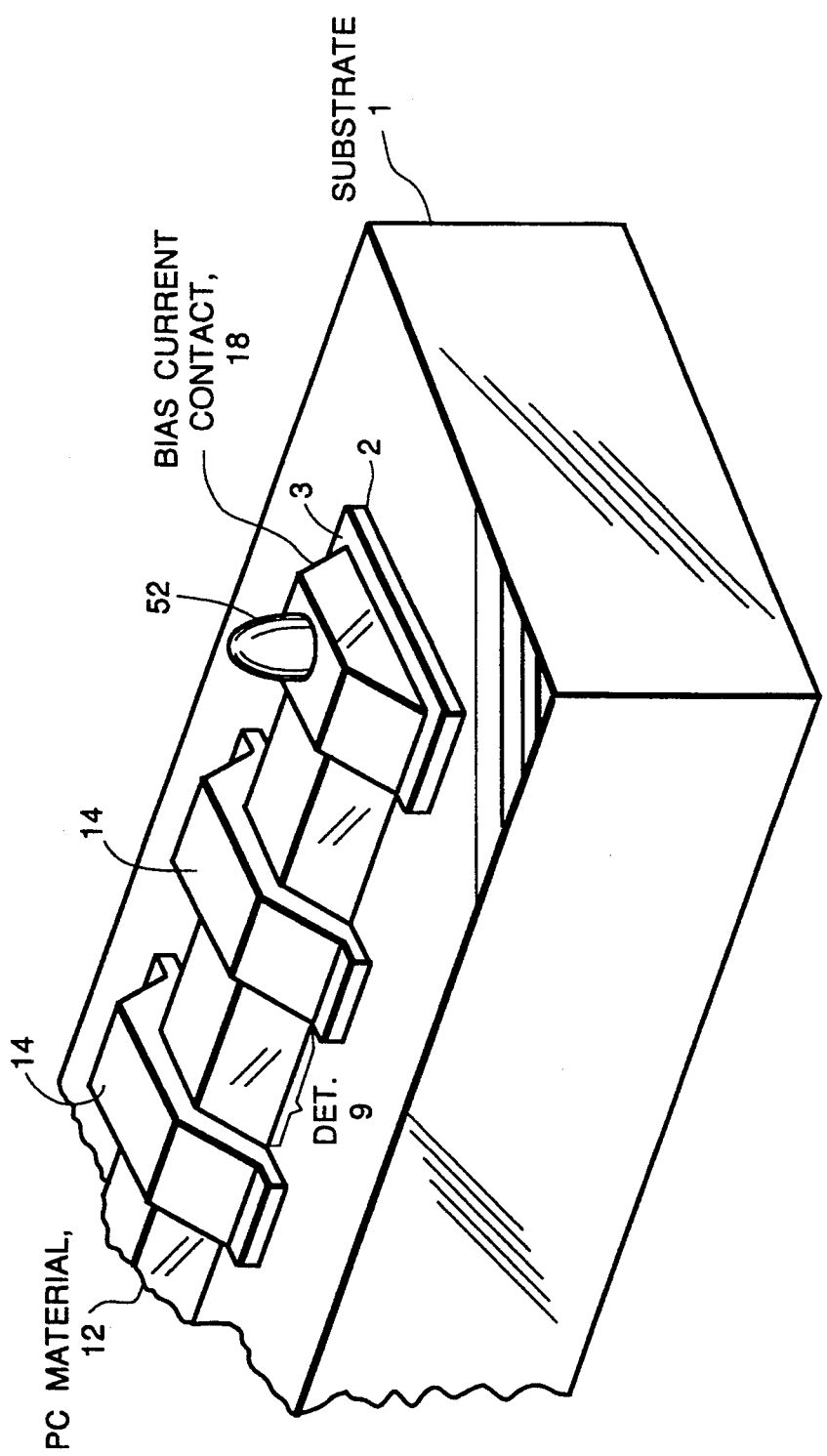

As an example of a 9×1 linear array 10 of FIG. 1a, reference is made to the elevational view of FIG. 4. A suitable substrate 1 is selected from a Group IIB-VIA alloy, such as CdTe. A layer of $Hg_xCd(1-x)Te$ is grown over the substrate 1 by, for example, a Liquid Phase Epitaxy (LPE) process, the layer of HgCdTe having a thickness in the range of approximately 10 microns to approximately 20 microns. The value of x is selected for setting the bandgap of the HgCdTe in accordance with the desired spectral responsivity of the PC detector, in a manner known in the art. The layer of HgCdTe is masked and selectively removed so as to leave a linear, electrically continuous body or strip 12 of PC material upstanding upon the surface of the substrate 1. The required electrical connections, such as a bias current input 16 (not shown) and output 18, and conductive taps 14 and interconnects, are fabricated by a photolithographic technique through the use of photoresist masks and metal deposition techniques, such as sputtering or chemical vapor deposition. By example, the contact metal system employs a thin layer 2 (approximately 500 Angstroms) of Ti that is overcoated with a thicker layer 3 (approximately 5000 Angstroms) of Au. Although not forming a part of the structure of the embodiment of FIG. 1a, in some embodiments of the invention vertical interconnects are also defined and fabricated, such as the indium bump 52.

The resulting array of PC detectors is operable for detecting IR radiation within a broad range of wavelengths (SWIR to VLWIR), as determined by the relative compositions of Hg and Cd in the PC material 12. As employed herein Short Wavelength Infrared (SWIR) radiation is considered to include a spectral region extending from approximately 1000 nm to approximately 4000 nm. Medium Wavelength Infrared (MWIR) radiation is considered to include a spectral region extending from approximately 3000 nm to approximately 8000 nm. Long Wavelength Infrared (LWIR) radiation is considered to include a spectral region extending from approximately 7000 nm to approximately 14000 nm. Very Long Wavelength Infrared (VLWIR) radiation is considered to include a spectral region extending from approximately 12000 nm to approximately 30000 nm. Although the bands overlap to some extent, for the purposes disclosed herein the overlap is not considered to be significant.

It should be realized that the foregoing description is exemplary. That is, it is also within the scope of the invention to apply the HgCdTe layer to the CdTe substrate by an epitaxial deposition process other than an LPE process, or to bond a bulk crystal of HgCdTe onto a surface of a supporting substrate, such as a substrate comprised of sapphire. Furthermore, and although the ensuing description is made in the context of IR PC detectors employing Group IIB-VIA material, the teaching of this invention is readily extended to PC detectors that operate at other regions of the electromagnetic spectrum, such as the visible, and that are comprised of other material systems, such as those based on Group IV material, such as silicon, or Group III-V material, such as GaAs.

FIG. 1a illustrates a top view of the linear array 10 of nine PC detectors (Detector 1–Detector 9). The linear strip 12 of PC material has a ten electrically conductive taps or traces 14, referred to herein also as interconnects, made completely across the strip 12. The traces 14 are regularly spaced apart and define, between two adjacently disposed traces 14, an active area of one PC Detector site or element. The traces 14, being in physical and electrical contact with the strip 12 of PC material, serve to recombine minority carriers, and thus reduce cross-talk between adjacent Detectors. A first end of the linear strip 12 of PC material is electrically coupled to the current carrying contact 16 whereby an input bias current is applied from a constant current source (not shown). A second end of the linear strip 12 of PC material is electrically coupled to the current carrying contact 18 whereby the bias current is extracted. As a result, a common bias current flows through all nine of the detector elements (Detector 1–Detector 9) of the array. 10.

The output of Detector 1 (Vout1) is obtained by measuring the potential difference between tap V1 and tap V2, the output of Detector 2 (Vout2) is obtained by measuring the potential difference between tap V2 and tap V3, and so forth. The difference between, for example, V1 and V2 is a function of the IR flux incident on the portion of the PC material that defines the active area of Detector 1. As such, the linear array 10 can be seen to operate as nine serially connected photoresponsive resistors that are driven with a constant current source.

Exemplary dimensions for the 9×1 linear PC array 10 are a total length of approximately 4000 microns and a width in the range of approximately 40 microns to approximately 400 microns. The magnitude of the bias current is on the order of milliamps.

The embodiment of a linear PC detector array 20 that is shown in FIG. 1b is similar to that of FIG. 1a, but does not employ the traces 14 to physically cross the strip of PC material 12. Instead, the strip 12 of PC material is fabricated so as to have outwardly projecting extensions 12a to which electrically conductive pads 15 are attached. In this embodiment of the invention minority carrier recombination does not occur, as in the embodiment of FIG. 1a, resulting in a larger output signal level. Furthermore, noise signals that may be generated due to surface states at the PC/metal interface are reduced. These two advantages are gained at the expense of a possibility of increased cross-talk between adjacent detector elements.

Figure 1C:
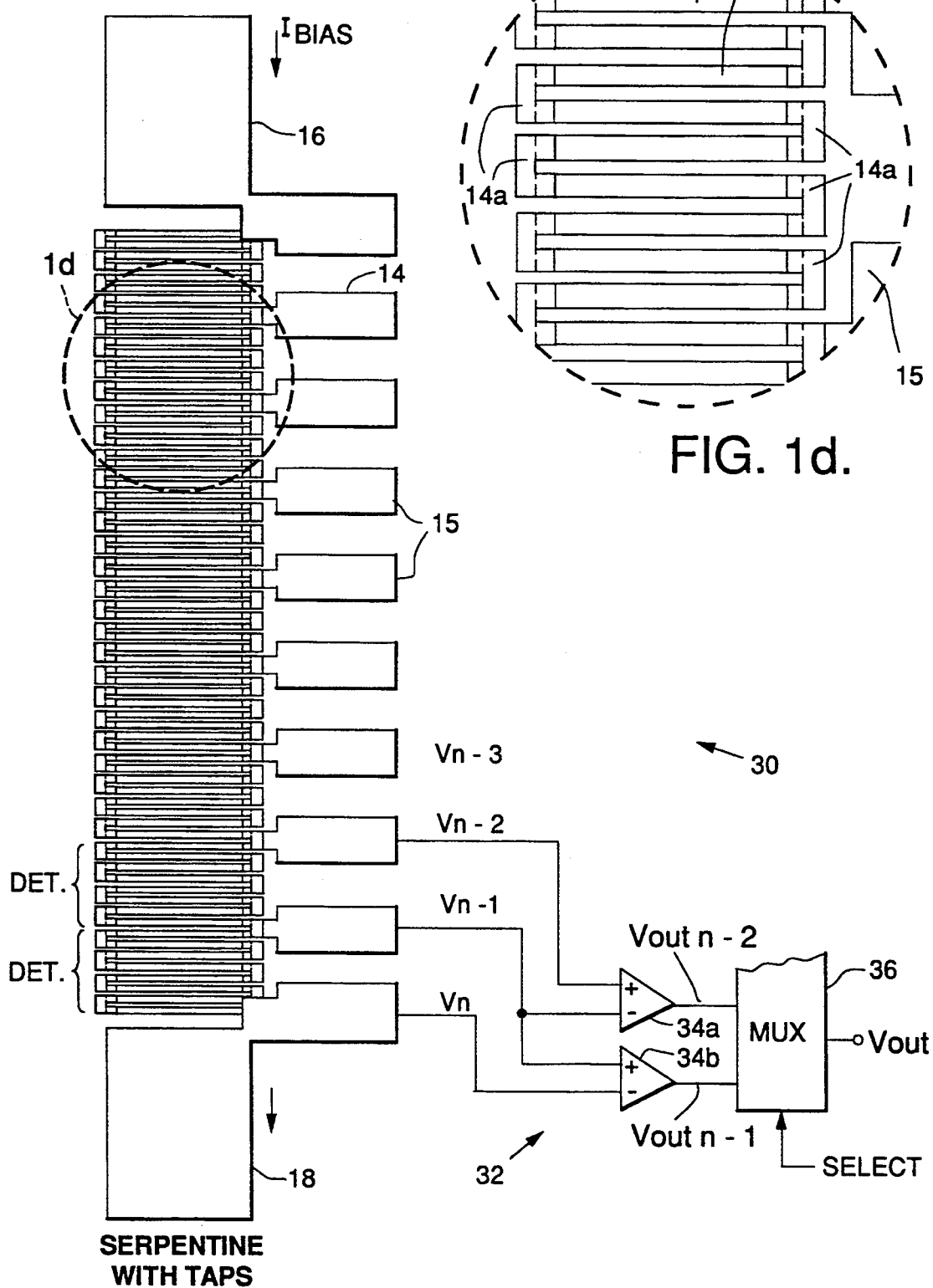

The embodiment of a linear PC detector array 30 that is shown in FIG. 1c has a serpentine geometry defined by a plurality of short discrete segments 12b of PC material. The segments 12b are disposed in a side-by-side parallel manner one with another, and are also disposed orthogonally to a long axis (length) of the array 30. In this embodiment the body of PC material is not fabricated so as to be electrically continuous across the length of the array 30, but is made so by a plurality of electrically conductive, non-photoresponsive pads 14a that electrically couple together the ends of adjacent segments 12b, in the manner shown in FIG. 1d the circular enlarged view of FIG. 1d. As can be seen, one Detector element is comprised of a plurality of the adjacent segments 12b that are disposed between two adjacent conductive pads 15. The embodiment of FIG. 1c increases the aspect ratio of the detector array, as compared to the embodiments of FIGS. 1a and 1b, in that a significantly greater length of PC material is contained within a given Detector site. This increase in aspect ratio is achieved through the repetitive folding of the PC material within the area of the Detector site.

FIG. 1c also illustrates an exemplary embodiment of signal processing electronics 32 that is suitable for use with any of the PC detector embodiments shown in the Figures. The electronics 32 includes a plurality of differentially connected amplifiers 34, only two of which are shown, for obtaining a difference between the voltage potentials appearing at two adjacent conductive pads 15 of the PC detector array 30. Outputs of the amplifiers 34a and 34b are provided to a multiplexer (MUX) 36 which, in response to Select input signals, provides at an output ($V_{OUT}$) a selected one of the amplifier 34 outputs. The signal processing circuitry may be integrated on the same substrate as the PC detector 30, or may be provided on a second substrate and interconnected before use with the substrate of the PC detector 30.

FIG. 2 shows a front-side illuminated embodiment of the invention wherein five of the 9×1 arrays of FIG. 1a are interconnected together to form a 9×5 PC detector area array 40. In this embodiment, five of the linear arrays 10 of FIG. 1a are fabricated in a side-by-side arrangement. During fabrication, electrically conductive straps 42 are formed for coupling adjacent ends of the arrays 10 together into the area array 40. The straps 42 are comprised of an electrically conductive, non-photoresponsive material such as a metal. The straps 42, in conjunction with the five linear arrays of PV material, provide a continuous path for the bias current ($I_{BIAS}$) from the input bias current contact 16 to the output bias current contact 18. Alternatively, the straps 42 can be provided by external wiring or conductors that are connected to the ends of the linear arrays through the use of, by example, indium bump interconnects.

For this front-side illuminated embodiment, wherein IR radiation is incident upon the array 40 without first passing through the substrate 1, the individual contact traces 14 can each be coupled to a conductive via that passes through the underlying substrate material. The signal processing electronics 32 can thus be disposed on a back, opposite surface of the substrate 1.

FIG. 3a shows an embodiment of the invention that is suitable for use in a back-side illuminated configuration, wherein the IR radiation first passes through the transparent substrate 1. A linear PC array 50 is comprised of nine detectors having electrically conductive traces that physically cross the PC material 12, as in the embodiment of FIG. 1a. However, in this embodiment of the invention a plurality of indium bumps 52 are formed on the traces 14, the input bias current contact 16, and the output bias current contact 18. One of the indium bumps 52 is shown in FIG. 4. The indium bumps 52 are fabricated in a conventional fashion, and are employed to mate the array 50 to externally provided signal processing circuitry during a hybridization process.

FIG. 3b shows a back-side illuminated embodiment of the invention wherein a plurality of the arrays 50 of FIG. 3a are interconnected together to form a 9×5 PC detector area array 60. The linear PC arrays 50 are interconnected with the conductive straps 42 of FIG. 2. One advantage bestowed by the use of the indium bumps 52 is that a greater packing density, or fill factor, is achieved, as compared to the embodiment of FIG. 2. That is, the linear arrays 50 can be more closely spaced together than the linear arrays 10 of FIG. 2. This results in a greater number of PC detectors, of comparable active area, being disposed within a smaller surface region of the substrate 1.

In summary, the invention provides for an array of PC radiation detectors that is comprised of a plurality of serially connected radiation detector elements that share a common source of bias current. The PC detectors can be formed as a single linear element, or as a plurality of separate elements. Electrical contacts that delineate element boundaries are formed as taps along the linear array. An optically generated signal for a single detector element is derived from a difference in potentials appearing between two adjacent taps or contacts.

In that a single bias current biases all detector elements, simple differential amplifiers circuits can be utilized to process the signal. This enables a low power operation of focal plane amplifiers and multiplexers. Large area, low power, PC arrays are designed with minimal input/output interconnects at the focal plane, thereby simplifying the construction of the resulting detector assembly. Furthermore, a single current source can be employed to bias an entire area array. If backside illuminated PC detector elements are utilized, connections can be made via indium bumps, or other suitable vertical interconnect technology, to an adjoining readout electronics integrated circuit.

It should be realized that the specific numbers of detectors per linear or area array, as described above, are exemplary, as are the number of linear arrays that are interconnected together to form an area array. Furthermore, a linear array or an area array can have other shapes than those illustrated in, for example, FIGS. 1a–1c and 3b. By example, for an area array the plurality of constituent linear arrays need not be parallel to one another, nor need they have the form of straight lines. It should also be realized that the body of PC material can be fabricated so as to have a serpentine shape, thereby eliminating the requirement for the conductive pads 14a (FIG. 1c) and/or the conductive straps 42 (FIGS. 2 and 3b).

Thus, while the invention has been particularly shown and described with respect to exemplary embodiments thereof, it will be understood by those skilled in the art that changes in form and details may be made therein without departing from the scope and spirit of the invention.

What is claimed is:

1. An array of photoconductive (PC) radiation detectors, comprising:
 a substrate:
 a body of PC material disposed upon a first surface of said substrate, said body of PC material having a substantially linear shape;
 a first plurality of electrical interconnects that are electrically coupled to said body of PC material for differentiating said body into a plurality of radiation detector sites, individual ones of said plurality of radiation detector sites being disposed in a serial arrangement with one another along a length of said body of PC material;
 a bias current input terminal that is electrically coupled to a first end of said body of PC material;
 a bias current output terminal that is electrically coupled to a second end of said body of PC material;
 wherein a bias current that is applied to said bias current input terminal and that is extracted from said bias current output terminal flows through each of said plurality of serially disposed radiation detector sites;
 signal processing circuitry having inputs coupled to said first plurality of electrical interconnects, said signal processing circuitry including means for determining a difference in potential between two adjacent ones of said first plurality of electrical interconnects, the difference in potential being a function of an amount of electromagnetic radiation that is absorbed by an intervening portion of said body of PC material.

2. An array of PC radiation detectors as set forth in claim 1 wherein individual ones of said first plurality of electrical interconnects are disposed across a width of said body at intervals along a length of said body.

3. An array of PC radiation detectors as set forth in claim 1 and further including a plurality of second electrical interconnects, individual ones of which are electrically coupled to said first plurality of electrical interconnects, each of said plurality of second electrical interconnects having a vertically oriented shape adapted for coupling to circuitry that is disposed upon a second substrate.

4. An array of PC radiation detectors as set forth in claim 1 wherein individual ones of said first plurality of electrical interconnects are electrically and physically coupled to said body at intervals along the length of said body of PC material.

5. An array of PC radiation detectors as set forth in claim 1 wherein individual ones of said first plurality of electrical interconnects are disposed at intervals across a width of said body and are electrically and physically coupled to said body for recombining minority charge carriers between adjacent ones of said radiation detector sites.

6. An array of PC radiation detectors as set forth in claim 1 wherein said body of PC material is comprised of a plurality of linear regions, and further including a second plurality of electrical interconnects, individual ones of which are electrically coupled between two of said plurality of linear regions of PC material for coupling said plurality of linear regions of PC material together into an area array of radiation detector sites, wherein said bias current input terminal is electrically coupled to an end of one of said plurality of linear regions, and wherein said bias current output terminal is electrically coupled to an end of another one of said plurality of linear regions.

7. An array of PC radiation detectors as set forth in claim 1 and further including a plurality of second electrical interconnects, individual ones of which are electrically coupled to said first plurality of electrical interconnects, each of said plurality of second electrical interconnects, having a vertically orientated shape adapted for coupling to circuitry that is disposed upon a second substrate.

8. An array of PC radiation detectors as set forth in claim 7 wherein radiation is incident upon a second surface of said substrate that is opposite said first surface, said substrate being selected so as to be substantially transparent to the incident radiation.

9. An array of PC radiation detectors as set forth in claim 1 wherein said body is comprised of a plurality of discrete linear segments of PC material, each of said linear segments being disposed orthogonally to a length of said body of PC material, and further including a plurality of second electrical interconnects, individual ones of which are electrically coupled between one end of adjacently disposed ones of said segments for coupling said plurality of segments together into a pattern having a serpentine shape.

10. An array of PC radiation detectors as set forth in claim 1 wherein said body of PC material is comprised of elements selected from Group IIB-VIA of the periodic table, and wherein a bandgap of the PC material is selected for absorbing infrared radiation.

11. An array of radiation detectors, comprising:
 a plurality of radiation detector elements;
 a bias current input terminal coupled to a first one of said plurality of radiation detector elements;
 a bias current output terminal coupled to a second one of said plurality of radiation detector elements;
 means for coupling said plurality of radiation detector elements together in a serial manner such that a bias current that is input to said bias current input terminal flows through said plurality of radiation detector elements and out of said bias current output terminal; and
 means for determining a magnitude of a voltage potential developed across each of said plurality of radiation detector elements, the magnitude of the voltage potential developed across one of said radiation detector elements being a function of an amount electromagnetic radiation that is absorbed by the radiation detector element.

12. An array of radiation detectors as set forth in claim 11 wherein each of said radiation detector elements is comprised of a photoconductive material, and wherein said coupling means is comprised of said photoconductive material.

13. An array of radiation detectors as set forth in claim 11 wherein each of said radiation detector elements is comprised of a photoconductive material, and wherein said coupling means is comprised of an electrically conductive, non-photoresponsive material.

* * * * *